(12) United States Patent
Yamauchi

(10) Patent No.: US 11,510,348 B2
(45) Date of Patent: Nov. 22, 2022

(54) SHIELD CASE

(71) Applicant: LAPIS SEMICONDUCTOR CO., LTD., Yokohama (JP)

(72) Inventor: Shigeki Yamauchi, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 58 days.

(21) Appl. No.: 17/210,578

(22) Filed: Mar. 24, 2021

(65) Prior Publication Data

US 2021/0307220 A1    Sep. 30, 2021

(30) Foreign Application Priority Data

Mar. 27, 2020   (JP) .............................. JP2020-057113

(51) Int. Cl.
*H05K 9/00*       (2006.01)

(52) U.S. Cl.
CPC .................................. *H05K 9/0028* (2013.01)

(58) Field of Classification Search
CPC ...................................................... H05K 9/0028
See application file for complete search history.

(56) References Cited

U.S. PATENT DOCUMENTS

| | | | | |
|---|---|---|---|---|
| 5,400,949 A * | 3/1995 | Hirvonen | ............... | H05K 9/003 228/180.1 |
| 7,138,584 B1 * | 11/2006 | Ju | .......................... | H05K 3/341 174/384 |
| D945,384 S * | 3/2022 | Yamauchi | .................... | D13/182 |
| 2002/0057560 A1 * | 5/2002 | Okada | .................. | H05K 9/0028 29/762 |
| 2005/0254224 A1 * | 11/2005 | Fagrenius | .............. | H05K 3/341 361/800 |
| 2007/0291464 A1 * | 12/2007 | Wang | .................. | H05K 9/0028 361/820 |
| 2009/0184405 A1 * | 7/2009 | Lu | ........................ | H01L 23/552 257/E23.114 |
| 2010/0061066 A1 * | 3/2010 | Guan | .................. | H05K 9/0026 361/752 |
| 2013/0322040 A1 * | 12/2013 | Watanabe | ............ | H05K 9/0024 361/760 |

(Continued)

FOREIGN PATENT DOCUMENTS

JP    2016114695 A    6/2016

*Primary Examiner* — Hung V Ngo
(74) *Attorney, Agent, or Firm* — Volentine, Whitt & Francos, PLLC

(57) ABSTRACT

A shield case for covering an electronic component includes a top panel portion made of a metal plate, a plurality of terminal leg portions formed to project in a direction intersecting with the top panel portion from a peripheral edge portion thereof, and a side plate portion formed to project in the direction intersecting with the top panel portion from a peripheral edge portion of the top panel portion other than the plurality of terminal leg portions. Each of the plurality of terminal leg portions includes a leg portion that stretches from the top panel portion, a joint portion that extends in a direction intersecting with the leg portion from a distal end of the leg portion, and a terminal portion with a ring-shaped cross-sectional surface that has a projecting support abutting on the leg portion from a distal end of the joint portion.

10 Claims, 11 Drawing Sheets

(56) References Cited

U.S. PATENT DOCUMENTS

| | | | | |
|---|---|---|---|---|
| 2013/0329381 | A1* | 12/2013 | Huang | H05K 9/0028 |
| | | | | 361/748 |
| 2017/0202115 | A1* | 7/2017 | Saito | H05K 9/0028 |
| 2017/0311438 | A1* | 10/2017 | Khorrami | H05K 1/18 |
| 2021/0307154 | A1* | 9/2021 | Nakamura | H05K 3/3442 |

* cited by examiner

SHIELD CASE

CROSS-REFERENCE TO RELATED APPLICATION

This application is based upon and claims the benefit of priority from the prior Japanese Patent Application No. 2020-057113 filed on Mar. 27, 2020, the entire contents of which are incorporated herein by reference.

BACKGROUND OF THE INVENTION

1. Technical Field

The present invention relates to a shield case installed on a printed substrate.

2. Description of the Related Art

In recent years, radio communication equipment has been desired to be usable under any environmental conditions and has been increasingly requested to reduce its size so as to be compact and easily portable and usable.

An electronic circuit module, such as a wireless module, internally mounted in the radio communication equipment is required to be shielded with a shield case, such as a metallic case, as a compatibility condition in, for example, a radio wave authentication. It is also desired a shield case that covers an electronic component installed on a printed substrate (hereinafter also referred to as a substrate) for a protection of an internal circuit of the electronic circuit module, anti-noise measures, and the like. For example, a shield case has a cubic box structure without a solder connection terminal and has a structure in which the shield case is mounted on the substrate and four side surfaces of the shield case are attached to the substrate by soldering (see JP-A-2016-114695).

SUMMARY OF THE INVENTION

There sometimes occurs a contraction or a warpage of the substrate when the radio communication equipment is used in the environment of drastic temperature change, or an impact generated when the equipment is dropped while it is carried around, a bending warpage and the like generated when the electronic circuit module is placed in a space with no room, which applies a large stress on a solder joint portion of a shield case and results in sometimes a defect of delamination of a joint portion.

The related art takes the measures to increase connection strength by increasing soldering portions of the shield case in order to solve the above-described failure of delamination. To increase the soldering portions, it is necessary to reduce a component area on the substrate or increase an outside dimension of the substrate. Furthermore, disadvantages such as an increased usage of solder for installing the shield case and an increased time of solder condition inspection of the solder joint portion are generated.

Additionally, what is called a shield case delamination, which is the delamination of the shield case from the substrate, has also occurred due to the lack of portions from which the stress escapes when the substrate warps because the solder joint portions are excessively increased.

The present invention has been made in consideration of the above-described problems, and it is an object of the present invention to provide a shield case that reduces the disadvantages of the related art and improve a problem of shield case delamination from a substrate.

A shield case according to the present invention is a shield case for covering an electronic component. The shield case includes a top panel portion, a plurality of terminal leg portions, and a side plate portion. The top panel portion is made of a metal plate. The plurality of terminal leg portions are formed to project in a direction intersecting with the top panel portion from a peripheral edge portion of the top panel portion. The side plate portion is formed to project in the direction intersecting with the top panel portion from a peripheral edge portion of the top panel portion other than the plurality of terminal leg portions. Each of the plurality of terminal leg portions includes a leg portion that stretches from the top panel portion, a joint portion that extends in a direction intersecting with the leg portion from a distal end of the leg portion, and a terminal portion with a ring-shaped cross-sectional surface that includes a projecting support abutting on the leg portion from a distal end of the joint portion.

The present invention ensures achieving the improved problem of shield case delamination from a substrate in an assembly of the substrate and the shield case.

DETAILED DESCRIPTION OF THE INVENTION

Figure 1:
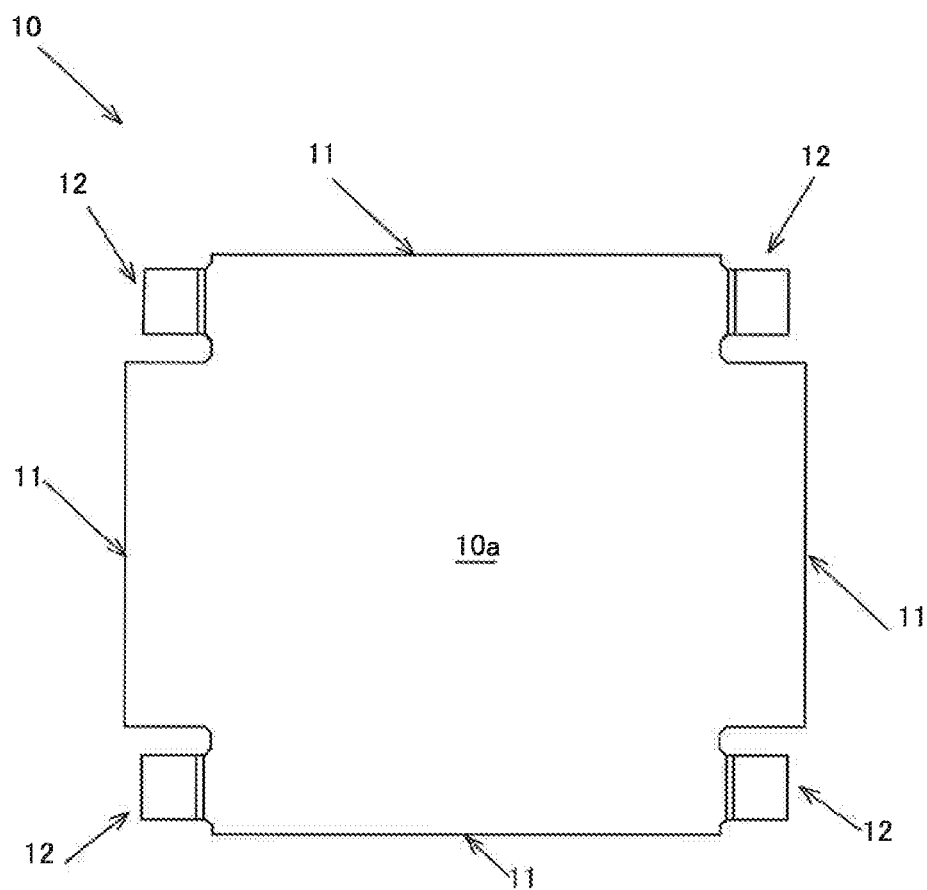
FIG. 1 is a top view of a shield case in a first embodiment according to the present invention.

The following describes embodiments according to the present invention in detail with reference to the drawings. Note that, in the embodiments, components having substantially identical functions and configurations are attached by identical reference numerals to omit repeated explanations.

First Embodiment

Figure 2:
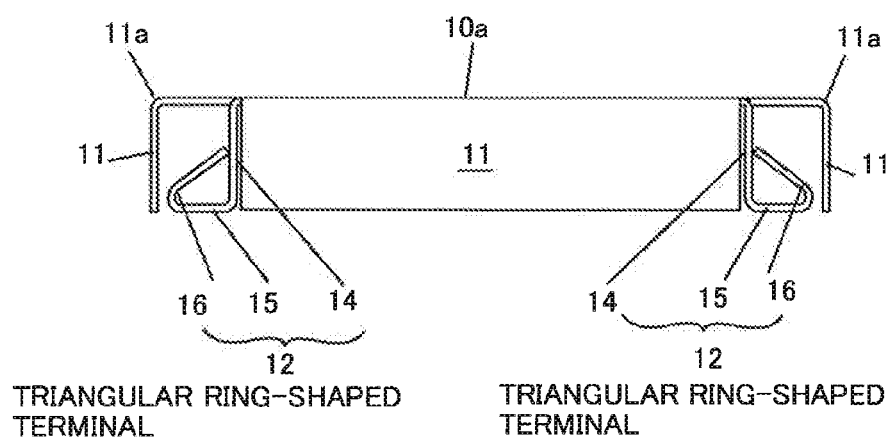
FIG. 2 is a side view of the shield case in the first embodiment.

FIG. 1 is a top view of a shield case 10 made of metal, such as copper, iron, or alloy, of a first embodiment. FIG. 2 is a side view of the shield case 10.

Figure 3:
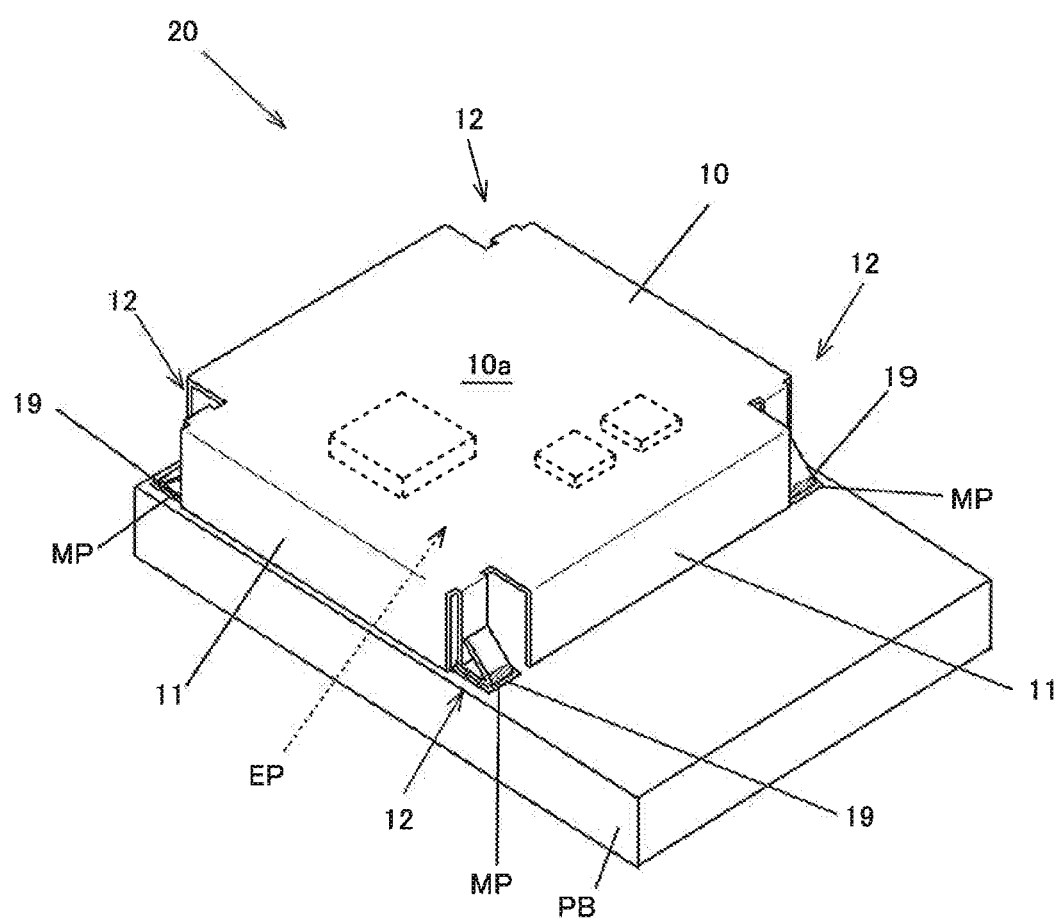
FIG. 3 is a perspective view illustrating an electronic circuit module in which the shield case in the first embodiment is installed on a substrate.

FIG. 3 is a perspective view of illustrating an electric circuit module (hereinafter also referred to as a module) 20, such as a wireless module, that includes the shield case 10. The module 20 is configured of a substrate PB on which various kinds of electronic components EP configuring an electric circuit are mounted and the shield case 10 that covers the components and is installed on the electric circuit via a solder 19.

The shield case 10 includes a rectangular top panel 10*a*, side plate portions 11 as sidewall sets of two opposed sides, and terminal leg portions 12 offset and formed on four corners of the top panel 10*a*, and has an approximately cuboid shape with a side of the substrate PB opened. A plurality of the four terminal leg portions each include a leg portion 14 that stretches in the normal direction from the top panel 10*a*, a joint portion 15 that extends in a direction intersecting with the leg portion 14 from a distal end of the leg portion 14, and a projecting support 16 that abuts on the leg portion 14 from a distal end of the joint portion 15. These leg portion 14, joint portion 15, and projecting support 16 configure a terminal portion with a ring-shaped vertical cross-section.

[Manufacturing Method of Shield Case]

Figure 4:
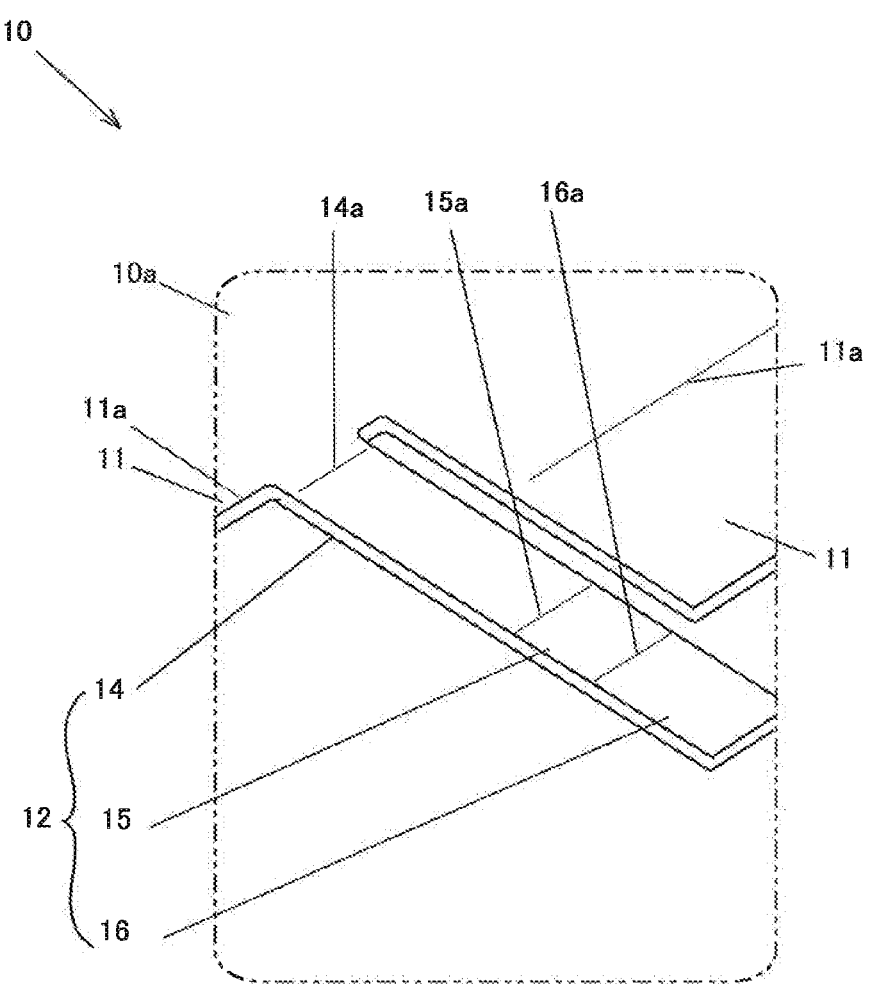
FIGS. 4 to 7 are perspective views of proximity of a terminal leg portion of the shield case to illustrate a sheet metal processing operation for the shield case in the first embodiment.

The shield case 10 is formed from a metallic plate by sheet metal processing. FIG. 4 to FIG. 7 are perspective views illustrating proximity of the terminal leg portion 12 to illustrate a sheet metal processing operation for the shield case 10. As illustrated in FIG. 4, the shield case 10 is formed from a metallic plate having the top panel 10*a*, a strip-shaped portion (the leg portion 14, the joint portion 15, and the projecting support 16) that serves as the terminal leg portion projecting out of the top panel 10*a*, and a strip-shaped portion (the side plate portion 11) that serves as the side plate portion by folding outward each of the strip-shaped portions in a direction intersecting with the top panel 10*a*.

Figure 5:
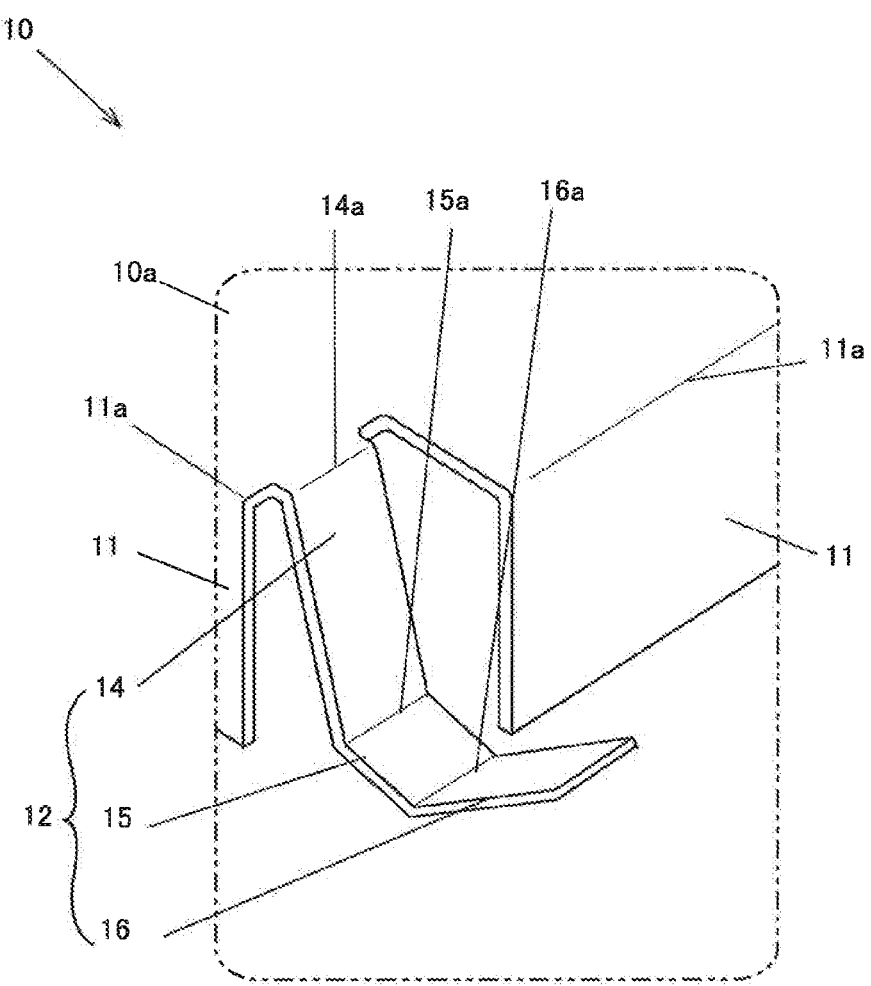

The side plate portions 11 are orthogonally bent outward with respect to the top panel 10*a* at mountain fold lines 11*a* to be formed to have a predetermined height as illustrated in FIG. 5.

Figure 6:
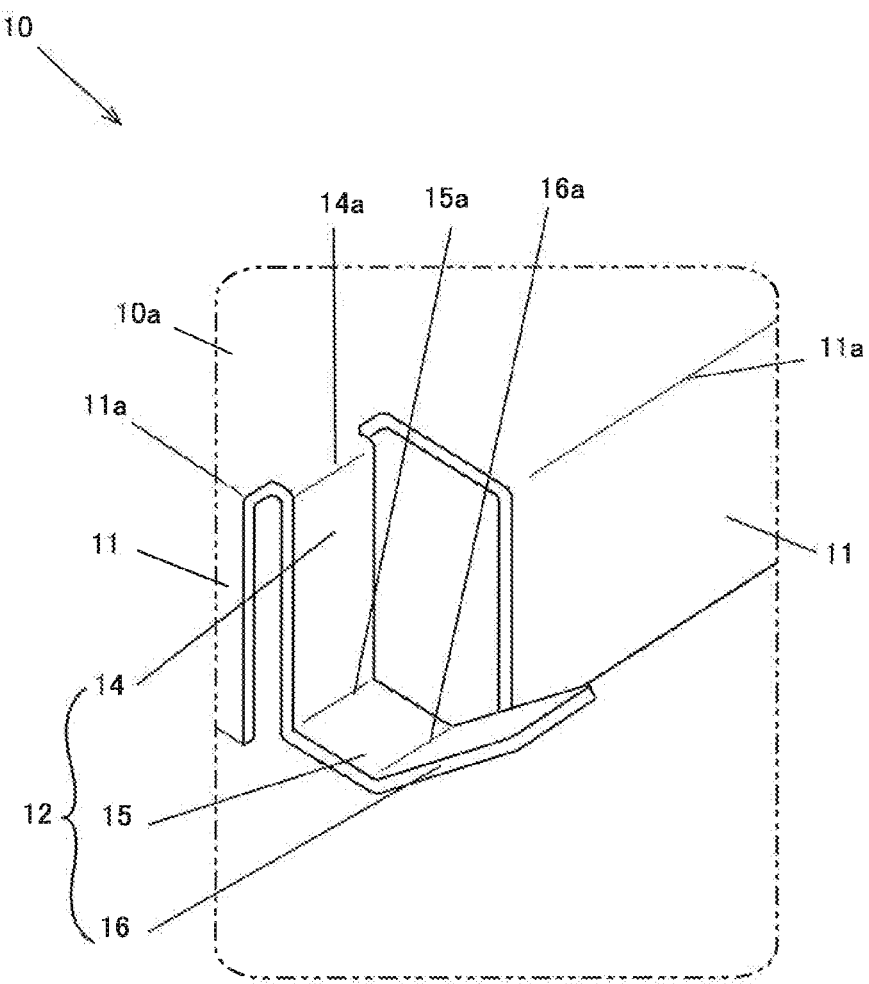

Each of the terminal leg portions 12 are formed as follows. For example, as illustrated in FIG. 5 and FIG. 6, the terminal leg portion 12 is orthogonally bent outward with respect to the top panel 10*a* at a mountain fold line 14*a*, its distal end is orthogonally bent at a first valley fold line 15*a* to form a portion of the leg portion 14 having a predetermined height. The predetermined heights of the side plate portion 11 and the leg portion 14 are set higher than a height of the electronic components so as to keep a space between the shield case 10 and the electronic components (not illustrated) covered by the shield case 10. However, the predetermined height of the side plate portion 11 is less than the predetermined height of the leg portion 14.

Figure 7:
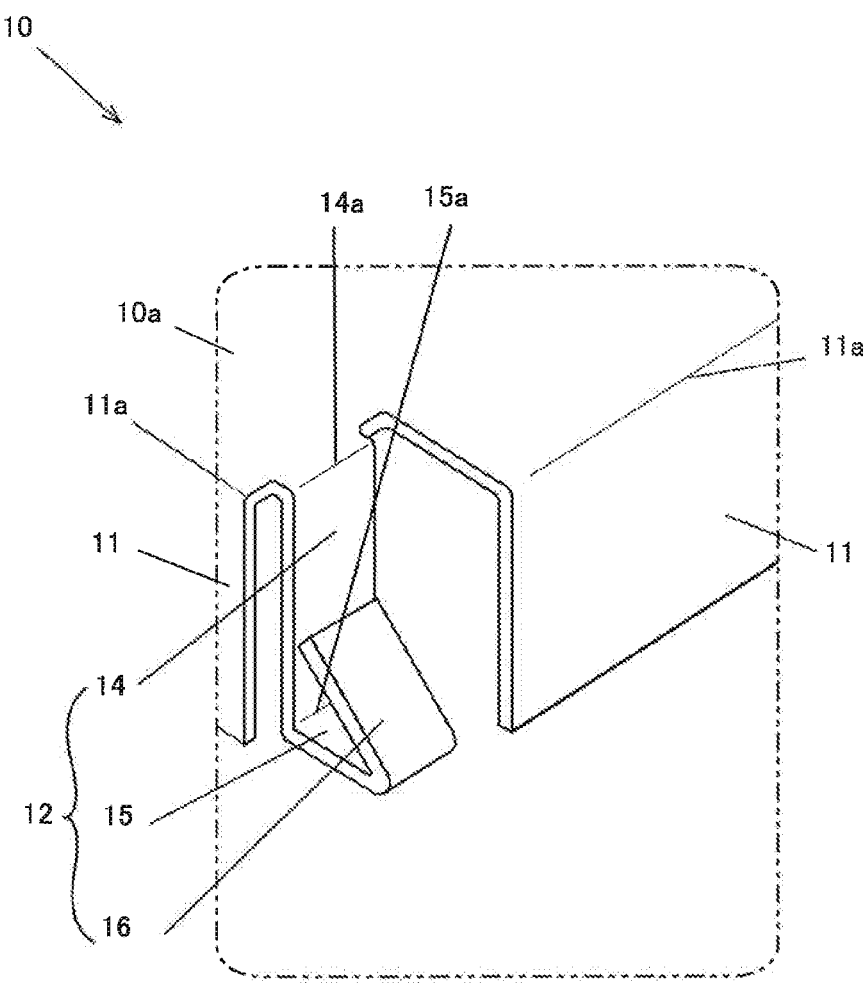

Next, as illustrated in FIG. 6 and FIG. 7, a portion between the first and a second valley fold line 15*a* and 16*a* is further bent at the second valley fold line 16*a* to form the joint portion 15 with a bottom having a predetermined flat joint surface to be solder joined. The projecting support 16 is formed by being further bent at the second valley fold line 16*a* and a ring its distal end brought into contact with the leg portion 14. Performing the above-described process on each of these terminal leg portions 12 form a triangular ring-shaped terminal portion having a triangular ring-shaped vertical cross-section configured of the leg portion 14, the joint portion 15, and the projecting support 16, and thus, the shield case 10 is completed.

[Module Assembly]

Figure 8:
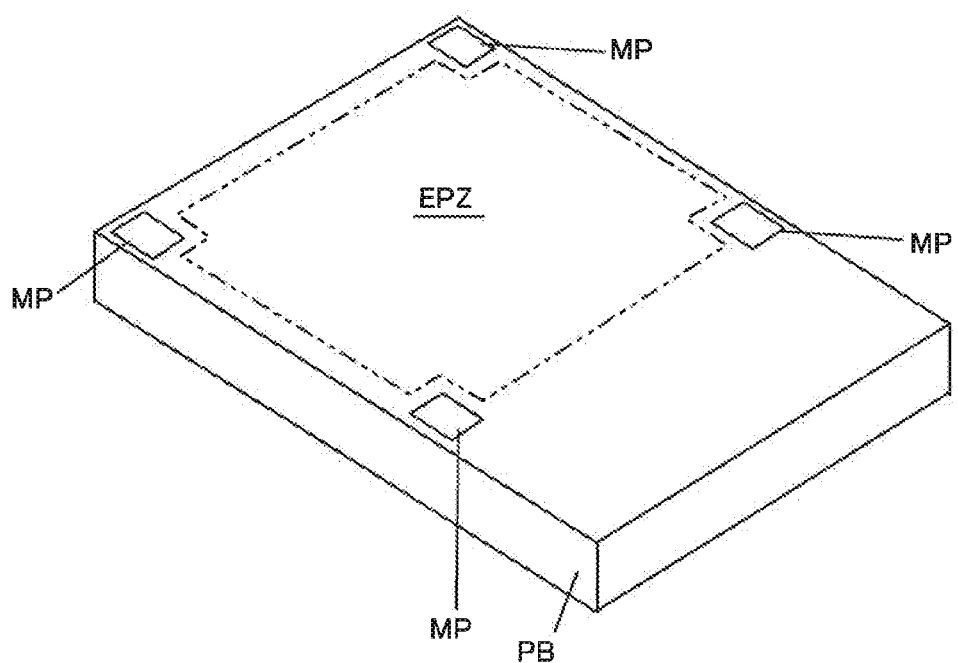
FIG. 8 is a perspective view of the substrate on which the shield case in the first embodiment is to be installed.

FIG. 8 is a perspective view of the substrate PB before assembling the module. On the substrate PB, metal pads MP made of conductor patterns are arranged and formed to correspond to the joint portions 15 located on the four corners of the shield case 10. The shield case 10 is installed on the metal pads MP via solder. The metal pad MP has its joint surface larger than a size of the joint portion 15 and is installed at a position where the joint portion 15 does not protrude out. For dimensions of the metal pad MP, a certain area size of the metal pad MP is required for a manufacturing tolerance of the shield case 10 and forming appropriate solder fillets outside and inside the joint portion 15. The metal pad MP can be arranged at, for example, approximately 0.3 mm away from an end of the substrate PB. As illustrated in FIG. 7, an electronic component mounted area EPZ, which the shield case 10 excluding the four corners for the four metal pads MP covers, is secured.

For example, placing the respective terminal leg portions 12 of the shield case 10 on the respective metal pads MP via a solder paste (not illustrated) and performing reflow for solder joining ensure obtaining the module 20 in which the shield case 10 is installed on the substrate PB illustrated in FIG. 3.

[Operation]

Figure 9:
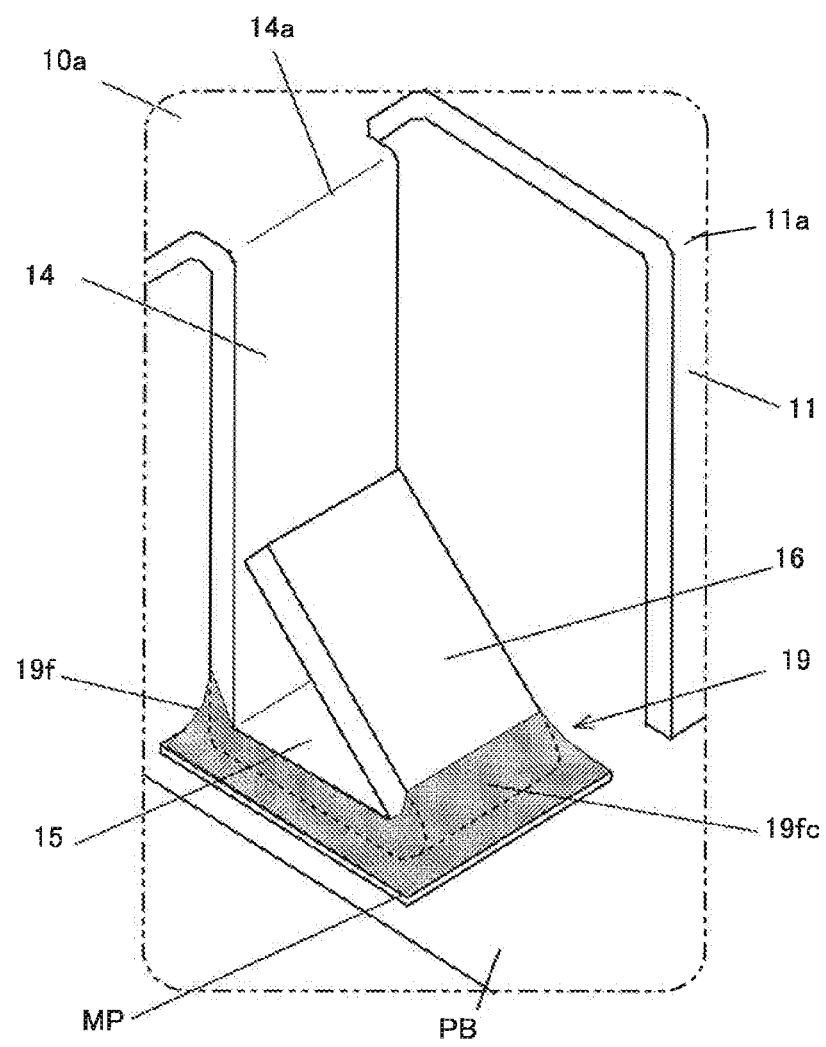
FIG. 9 is a perspective view of proximity of the terminal leg portion of the shield case in the first embodiment.

FIG. 9 is a perspective view of proximity of the terminal leg portion 12 of the shield case 10. During solder heating, such as the reflow, the melt solder 19 spreads between the joint portion 15 and the metal pad MP. Since the size of the joint portion 15 is smaller than the size of the metal pad MP, a solder fillet 19*f* is formed around the joint portion 15. Furthermore, the triangular ring-shaped structure forms not only the solder fillet 19*f* at a side of the leg portion 14 but also a solder fillet 19*fc* spread over to an outer curved side surface of the projecting support 16 on the opposite side.

According to this embodiment, since the projecting support 16 that continues from the joint portion 15 and brought into contact with the leg portion 14 is disposed, a joint area of the solder is increased by the solder fillet 19*fc* in contact with the projecting support 16. This ensures increasing the joining strength of the shield case 10.

For example, when the module 20 at the product shipping is placed in a test socket for module (not illustrated) and the top panel 10*a* is pressed toward the substrate PB, the large stress concentrates near the portion of the leg portion 14 of the shield case 10. According to this embodiment, even though the leg portion 14 bends, the distal-end of the projecting support 16 serves as a support of the leg portion 14 to disperse the stress, thereby providing an effect of reducing the deformation of the leg portion 14 of the shield case 10.

Thus, forming the terminal portion structure of the terminal leg portion 12 on the four corner of the shield case 10 into the ring-shaped structure increases the mechanical strength, thereby providing an effect of reducing the shield case delamination. There also is an advantage of eliminating the necessity of changing the metal pad MP of the substrate PB into peculiar shape and size in particular.

Generally, when the outside dimension of the module is desired to be decreased or when the shield case 10 is desired to be in a peculiar shape, it is necessary to thin the thickness of the shield case 10 (the thickness of the material metal plate), but thinning the thickness of the shield case 10 reduces resistance of the mechanical strength. On the other hand, with the ring-shaped terminal portion of this embodiment, the thinner the thickness of the sheet metal for the shield case 10 is, the more effective it becomes in maintaining the strength.

As described above, according to this embodiment, the strength of the leg portion of the shield case 10 and the solder joining strength improve to ensure sufficiently holding the shield case 10. Accordingly, this embodiment can contribute to downsize and densify the module 20 without increasing the cost.

[Modification]

Figure 10:
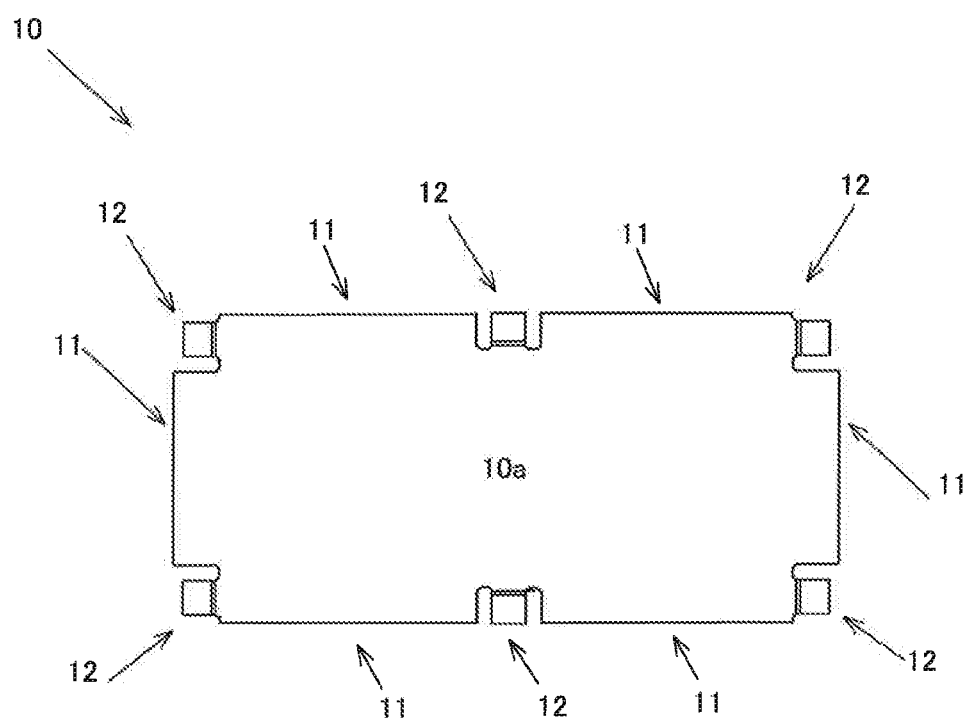
FIG. 10 is a top view of a shield case of a modification in the first embodiment according to the present invention.

While, in the above embodiment, the respective terminal leg portions 12 are disposed at the four corners of the shield case 10, the installation position of the terminal leg portions 12 is not limited to this. That is, in a modification of this embodiment, a part of the terminal leg portions 12 may be formed in a middle portion between the corner portions of the shield case 10 as illustrated in the top view of the shield case illustrated in FIG. 10.

Second Embodiment

Figure 11:
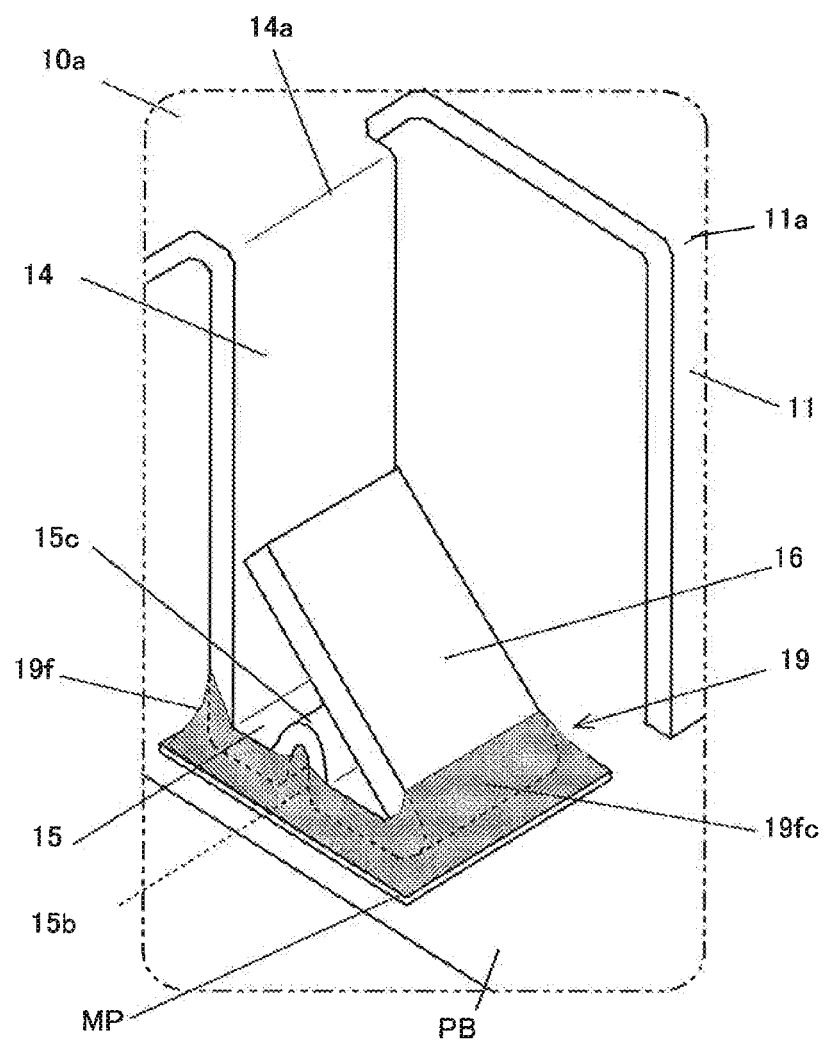
FIG. 11 is a perspective view of proximity of a terminal leg portion of a shield case in a second embodiment.

FIG. 11 illustrates a perspective view of proximity of the terminal leg portion 12 in a main part of the shield case 10 in this second embodiment. The shield case 10 of this embodiment has the same configuration as that of the first embodiment except that the shape of the joint portion 15 of the shield case 10 is different with respect to the first embodiment as illustrated in FIG. 5.

In the shield case in this embodiment, a projecting portion 15c that projects in a normal direction of the joint surface is disposed at the center of the joint portion 15 such that a groove that extends in a width direction of the joint surface of the joint portion 15, that is, a depressed portion 15b is formed.

In the shield case of this embodiment, the solder is filled in the depressed portion 15b in addition to the solder fillet 19f around the joint portion 15 when solder joining is performed.

Since the solder 19 is filled in the depressed portion 15b of the joint portion 15, in addition to the effect of the first embodiment, the joint area between the solder 19 and the shield case 10 (the joint portion 15) increases, thereby ensuring further improved joining strength of the shield case 10. Note that the number of the depressed portion 15b of the joint portion 15 may be plural, and a stretching direction of the depressed portion 15b can be conveniently set.

Third Embodiment

Figure 12:
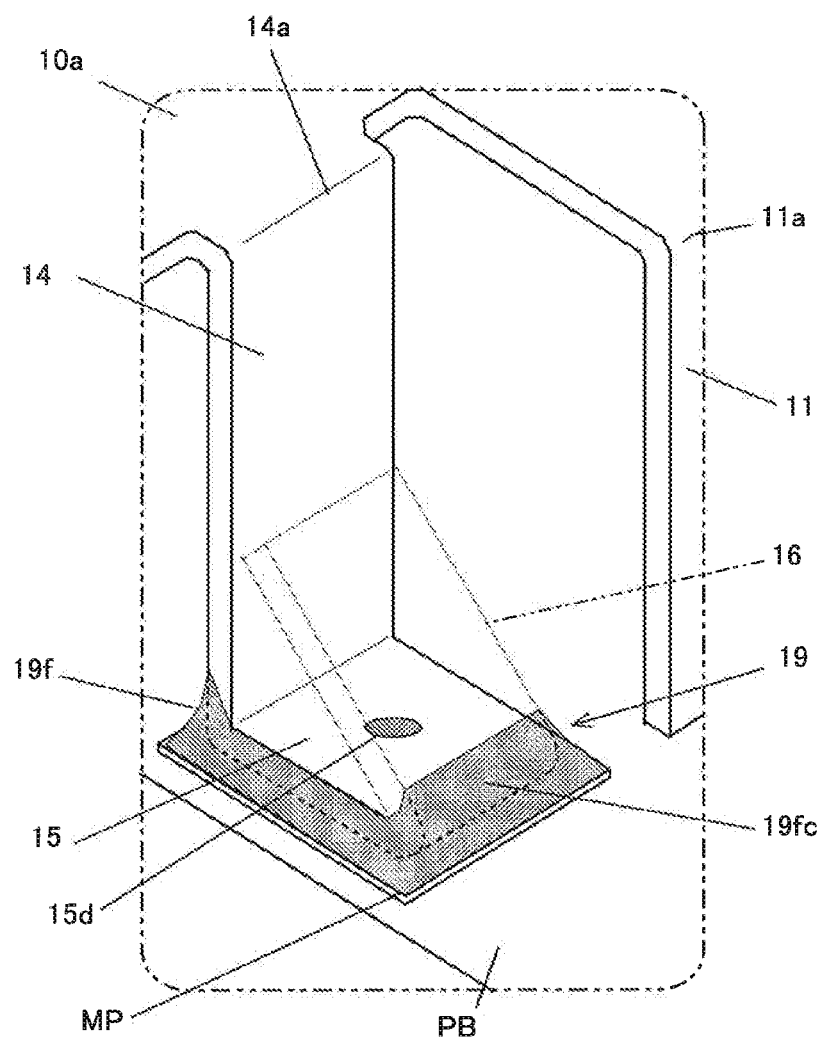
FIG. 12 is a perspective view of proximity of a terminal leg portion of a shield case in a third embodiment.

FIG. 12 illustrates a perspective view of proximity of the terminal leg portion 12 in a main part of the shield case 10 of this third embodiment (however, it is illustrated by the two-dot chain line in order to see through the projecting support 16). The shield case 10 in this embodiment has the same configuration as that of the first embodiment except that the shape of the joint portion 15 of the shield case 10 is different with respect to the first embodiment as illustrated in FIG. 5. In the shield case according to this embodiment, a through-hole 15d is provided in the center of the joint portion 15.

In the shield case of this embodiment, the solder is filled in the through-hole 15d in addition to the solder fillet 19f around the joint portion 15 when the solder joining is performed.

Since the solder 19 is filled in the through-hole 15d of the joint portion 15, in addition to the effect of the first embodiment, the joint area between the solder 19 and the shield case 10 (the joint portion 15) increases, thereby ensuring further improved joining strength of the shield case 10. That is, since the through-hole 15d is provided on the joint portion 15, the solder fillet 19f formed on the inner peripheral wall increases, thereby ensuring further improved joining strength of the shield case 10. Note that the number of the through-hole 15d of the joint portion 15 may be plural, and an arranging direction when a plurality of the through-holes 15d are provided can be conveniently set.

In any of the embodiments, the above-described shield case structure is applicable as a shield case installed on a rigid substrate or as a shield case installed on a flexible substrate. For example, the above-described shield case structure can be used for a module including a shield case that blocks a high frequency and a communication device, such as a smart phone and a portable information terminal, that uses the module.

What is claimed is:

1. A shield case for covering an electronic component, the shield case comprising:
   a top panel portion made of a metal plate;
   a plurality of terminal leg portions formed to project in a direction intersecting with the top panel portion from a peripheral edge portion of the top panel portion; and
   a side plate portion formed to project in the intersecting with the top panel portion from a peripheral edge portion of the top panel portion other than the plurality of terminal leg portions, wherein
   each of the plurality of terminal leg portions includes a leg portion that stretches from the top panel portion, a joint portion that extends in a direction intersecting with the leg portion from a distal end of the leg portion, and a terminal portion with a ring-shaped cross-sectional surface that includes a projecting support abutting on the leg portion from a distal end of the joint portion.

2. The shield case according to claim 1, wherein the joint portion of the terminal portion is a part to be solder joined.

3. The shield case according to claim 2, wherein the plurality of terminal leg portions are formed on respective corner portions of the shield case.

4. The shield case according to claim 3, wherein the joint portion of the terminal portion has a depressed portion.

5. The shield case according to claim 3, wherein the joint portion of the terminal portion has a through-hole.

6. The shield case according to claim 2, wherein a part of the plurality of terminal leg portions is formed in a middle portion between corner portions of the shield case.

7. The shield case according to claim 6, wherein the joint portion of the terminal portion has a depressed portion.

8. The shield case according to claim 6, wherein the joint portion of the terminal portion has a through-hole.

9. The shield case according to claim 2, wherein the joint portion of the terminal portion has a depressed portion.

10. The shield case according to claim 2, wherein the joint portion of the terminal portion has a through-hole.

\* \* \* \* \*